US012769215B2

(12) United States Patent
Chien et al.

(10) Patent No.: US 12,769,215 B2
(45) Date of Patent: Oct. 20, 2026

(54) ALIGNMENT MARK AND METHOD

(71) Applicant: Taiwan Semiconductor Manufacturing Co., Ltd., Hsinchu (TW)

(72) Inventors: Hung-Chung Chien, Hsinchu (TW); Chih-Chieh Yang, Hsinchu (TW); Hao-Ken Hung, Hsinchu (TW); Ming-Feng Shieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1 day.

(21) Appl. No.: 19/172,343

(22) Filed: Apr. 7, 2025

(65) Prior Publication Data

US 2025/0237966 A1 Jul. 24, 2025

Related U.S. Application Data

(63) Continuation of application No. 17/460,580, filed on Aug. 30, 2021, now Pat. No. 12,292,694.

(51) Int. Cl.
*G03F 7/00* (2006.01)
*H10W 46/00* (2026.01)

(52) U.S. Cl.
CPC ...... *G03F 7/70633* (2013.01); *G03F 7/70625* (2013.01); *G03F 7/70683* (2013.01); *H10W 46/00* (2026.01)

(58) Field of Classification Search
CPC ............. G03F 7/70633; G03F 7/70625; G03F 7/70683; H10W 46/00; H10P 74/203; H10P 74/27; H10P 74/23; H10P 74/20; H10P 74/273
See application file for complete search history.

(56) References Cited

U.S. PATENT DOCUMENTS

| | | | | |
|---|---|---|---|---|
| 9,012,270 | B2 * | 4/2015 | Xu | H10D 89/10 438/587 |
| 9,748,226 | B1 * | 8/2017 | Chen | H10D 1/68 |
| 10,651,129 | B1 * | 5/2020 | Hironaka | G03F 7/70633 |
| 11,604,420 | B2 * | 3/2023 | Pandev | G03F 7/70516 |
| 11,604,421 | B1 * | 3/2023 | Hong | G03F 7/70633 |
| 2010/0167513 | A1 * | 7/2010 | Blatchford | G03F 7/70633 356/399 |
| 2011/0115057 | A1 * | 5/2011 | Harn | G03F 9/7084 257/E23.179 |
| 2013/0026571 | A1 * | 1/2013 | Kawa | G06F 30/327 257/E21.602 |
| 2014/0002822 | A1 * | 1/2014 | Chen | G03F 7/70633 257/E23.179 |
| 2014/0351771 | A1 * | 11/2014 | Amir | G03F 7/70633 716/50 |

(Continued)

*Primary Examiner* — Michelle M Iacoletti
*Assistant Examiner* — Maher Yazback
(74) *Attorney, Agent, or Firm* — Seed IP Law Group

(57) ABSTRACT

A device includes a diffraction-based overlay (DBO) mark having an upper-layer pattern disposed over a lower-layer pattern, and having smallest dimension greater than about 5 micrometers. The device further includes a calibration mark having an upper-layer pattern disposed over a lower-layer pattern, positioned substantially at a center of the DBO mark, and having smallest dimension less than about ⅕ the size of the smallest dimension of the DBO mark.

20 Claims, 13 Drawing Sheets

(56) References Cited

U.S. PATENT DOCUMENTS

| | | | | |
|---|---|---|---|---|
| 2016/0275226 | A1* | 9/2016 | Wang | G06F 30/39 |
| 2016/0307850 | A1* | 10/2016 | Lin | G03F 7/70633 |
| 2017/0336198 | A1* | 11/2017 | Adel | G01B 11/272 |
| 2018/0284624 | A1* | 10/2018 | Ausschnitt | G01B 11/24 |
| 2019/0101835 | A1* | 4/2019 | Chen | G03F 7/70633 |
| 2021/0382402 | A1* | 12/2021 | Ma | G03F 7/70633 |
| 2022/0013468 | A1* | 1/2022 | Volkovich | G01B 21/22 |
| 2022/0415725 | A1* | 12/2022 | Steely-Tarshish | H10P 74/27 |

* cited by examiner

ALIGNMENT MARK AND METHOD

PRIORITY CLAIM AND CROSS-REFERENCE

This application is a continuation of U.S. Non-Provisional application Ser. No. 17/460,580, filed Aug. 30, 2021, which is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
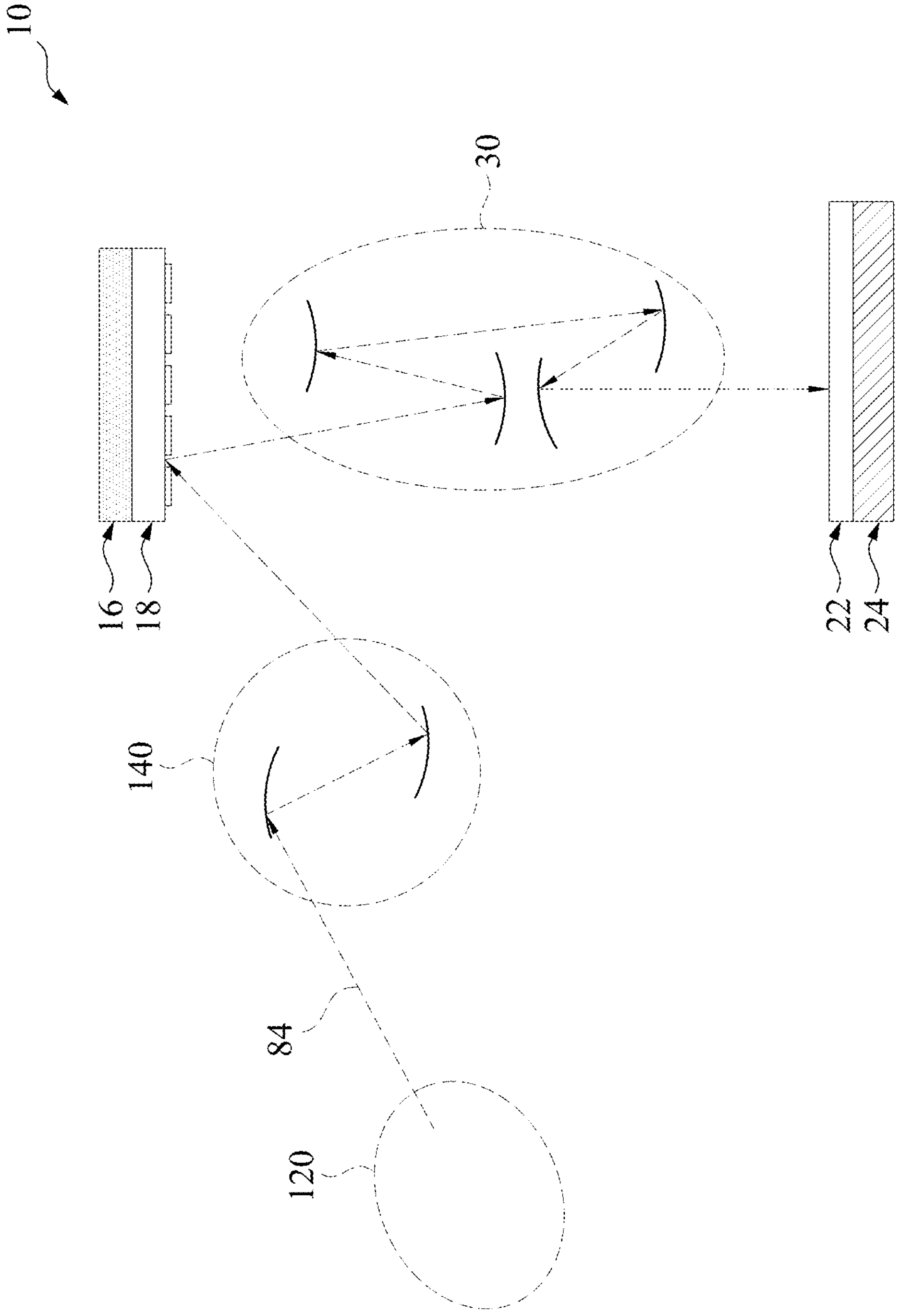
FIG. 1 is a view of a portion of a lithography scanner according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms. For example, "about" may indicate variation in a dimension of 20%, 10%, 5% or the like, but other values may be used when appropriate. A large feature, such as the longest dimension of a semiconductor fin may have variation less than 5%, whereas a very small feature, such as thickness of an interfacial layer may have variation of as much as 50%, and both types of variation may be represented by the term "about." "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

Semiconductor fabrication generally involves the formation of electronic circuits by performing multiple depositions, etchings, annealings, and/or implantations of material layers, whereby a stack structure including many semiconductor devices and interconnects between is formed. Dimension scaling (down) is one technique employed to fit ever greater numbers of semiconductor devices in the same area. However, dimension scaling is increasingly difficult in advanced technology nodes. Lithography techniques, used to form features in the material layers, ensure accurate patterning at the scaled-down dimensions by employing ever shorter exposure wavelengths, including deep ultraviolet (DUV; about 193-248 nanometers), extreme ultraviolet (EUV; about 10-100 nanometers; particularly 13.5 nanometers), and X-ray (about 0.01-10 nanometers).

Following formation of features in one material layer, further features may be formed in the next material layer. However, at such small dimensions, even the slightest shift in the lithography step can lead to circuit failure. For example, when forming a metal line over a metal via, an imprecise mask overlay can lead to etching low-k dielectric material laterally separating the metal via from neighboring metal vias. When metal line is formed following etching, the metal line may extend vertically and laterally into the low-k dielectric material region, which reduces isolation distance between the metal line and a neighboring metal via. In the worst case, a short circuit may occur. However, even if the metal features remain isolated by the low-k dielectric material, albeit with less physical separation, time-dependent dielectric breakdown, or "TDDB," of the low-k dielectric material isolating the metal features may be reduced dramatically, which reduces lifetime of the integrated circuit. This is but one example highlighting the consequences of imperfect alignment between material layers during fabrication. Many other undesirable outcomes arise from imperfect alignment, which affect not only metallization layers, but also semiconductor fins, gate-all-around (GAA) gate structures, contact structures, and the like.

To improve layer-to-layer alignment, and mitigate the above-mentioned defect risks, alignment marks may be employed during semiconductor fabrication. In the embodiments of this disclosure, a hybrid overlay alignment mark is described, which includes a diffraction-based overlay (DBO) pattern and a device-like calibration mark, each having a center located at about the same position. It has been observed that overlay accuracy is inversely proportional to distance between the DBO pattern and the calibration mark, particularly due to mask and/or lens fingerprint, which cause randomized shifts at various regions over the area of the mask used to pattern each material layer. As such, by locating the calibration mark at, e.g., a center region, of the DBO pattern, the distance is dramatically reduced, and the overlay accuracy is increased. It is also observed that DBO pattern and calibration mark topography are generally quite different, which can negatively impact DBO measurement and result in poor accuracy. As such, by configuring the calibration mark to have greatly reduced area ("device-like"), and locating the calibration mark symmetrically in and/or around the DBO pattern, topography impact during DBO measurement is dramatically reduced, again increasing overlay accuracy. Further, whereas a large calibration mark (e.g., 10-1000× dimension versus semiconductor device dimensions) may exhibit overlay behavior that is divergent from the semiconductor devices being fabricated due to lens aberration and/or different process capability, the device-like calibration mark having very small dimensions (e.g., <10× dimensions) can alleviate this variation in overlay behavior.

FIG. 1 is a schematic and diagrammatic view of a lithography exposure system 10, in accordance with some embodiments. In some embodiments, the lithography exposure system 10 is an extreme ultraviolet (EUV) lithography system designed to expose a resist layer by EUV radiation, and may also be referred to as the EUV system 10. The lithography exposure system 10 includes a light source 120, an illuminator 140, a mask stage 16, a projection optics module (or projection optics box (POB)) 30 and a substrate stage 24, in accordance with some embodiments. The elements of the lithography exposure system 10 can be added to or omitted, and the disclosure should not be limited by the embodiment.

The light source 120 is configured to generate light radiation having a wavelength ranging between about 1 nm and about 100 nm in certain embodiments. In one particular example, the light source 120 generates an EUV radiation with a wavelength centered at about 13.5 nm. Accordingly, the light source 120 is also referred to as an EUV radiation source. However, it should be appreciated that the light source 120 should not be limited to emitting EUV radiation. The light source 120 can be utilized to perform any high-intensity photon emission from excited target fuel.

In various embodiments, the illuminator 140 includes various refractive optic components, such as a single lens or a lens system having multiple reflectors 100, for example lenses (zone plates) or alternatively reflective optics (for EUV lithography exposure system), such as a single mirror or a mirror system having multiple mirrors in order to direct light from the light source 120 onto the mask stage 16, particularly to a mask 18 secured on the mask stage 16. In the present embodiment where the light source 120 generates light in the EUV wavelength range, reflective optics are employed. In some embodiments, the illuminator 140 includes at least three lenses.

The mask stage 16 is configured to secure the mask 18. In some embodiments, the mask stage 16 includes an electrostatic chuck (e-chuck) to secure the mask 18. This is because gas molecules absorb EUV radiation and the lithography exposure system for the EUV lithography patterning is maintained in a vacuum environment to avoid EUV intensity loss. In the present disclosure, the terms mask, photomask, and reticle are used interchangeably. In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a reflective multilayer deposited on the substrate.

The projection optics module (or projection optics box (POB)) 30 is configured for imaging the pattern of the mask 18 on to a semiconductor wafer 22 secured on the substrate stage 24 of the lithography exposure system 10. In some embodiments, the POB 30 has refractive optics (such as for a UV lithography exposure system) or alternatively reflective optics (such as for an EUV lithography exposure system) in various embodiments. The light directed from the mask 18, carrying the image of the pattern defined on the mask, is collected by the POB 30. The illuminator 140 and the POB 30 are collectively referred to as an optical module of the lithography exposure system 10. In some embodiments, the POB 30 includes at least six reflective optics.

In the present embodiment, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV radiation in the present embodiment. Various components including those described above are integrated together and are operable to perform lithography processes.

The lithography exposure system 10 may further include other modules or be integrated with (or be coupled with) other modules, such as a cleaning module designed to provide hydrogen gas to the light source 120. The hydrogen gas helps reduce contamination in the light source 120.

Figure 2B:
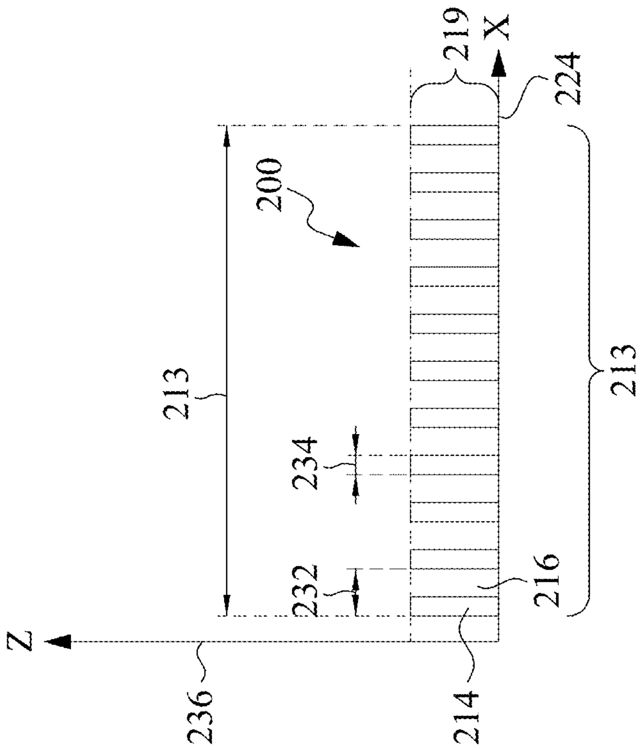
FIGS. 2A-5 are views of diffraction-based overlay (DBO) marks according to various aspects of the present disclosure.
Figure 2A:
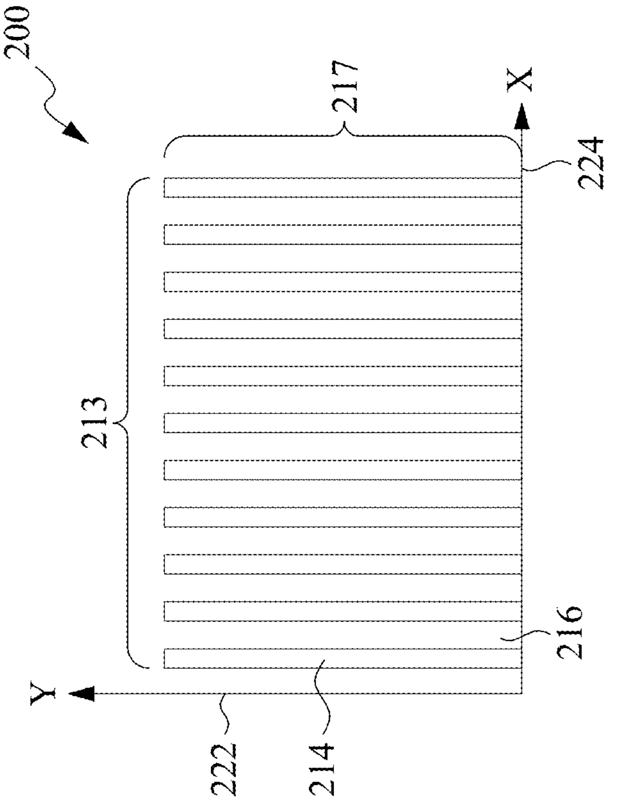

FIGS. 2A and 2B respectively illustrate a top view and a cross-sectional view of an overlay measurement pattern to be generated by a light beam lithography system on a wafer. FIG. 2A shows an overlay measurement pattern 200 that is extended in a Y-direction 222 with a length 217 and is distributed in an X-direction 224 in an extent 213. The overlay measurement pattern 200 includes dark strips 214 and bright strips 216. In some embodiments, dark strips 214 are low reflectance portions and the bright strips 216 are high reflectance portions when an incident light beam radiates the overlay measurement pattern 200. In some embodiments, the alternating dark strips 214 and the bright strips 216 generate a grating with an overlay measurement pattern.

FIG. 2B shows a cross-sectional view of the overlay measurement pattern 200 that is extended in a Z-direction 236 with a height 219 and is distributed in the X-direction 224 in the extent 213. In some embodiments, the dark strips 214 are the features of a layer (e.g., a photo resist pattern) that are remained after a lithography process is applied and the bright strips 216 are the locations that are removed after the lithography process is applied. In other embodiments, the role of the dark patterns and the bright patterns are reversed depending, for example, on a material of the underlying layer. As shown in the cross-sectional view, the dark strips 214 have a width 234, e.g., critical dimension (CD), and the overlay measurement pattern 200 has a pitch 232. In some embodiments, when a wavelength of the incident light beam is comparable with the width 234 and/or the pitch 232 of the overlay measurement pattern, the incident light beam is diffracted and a portion of the incident light beam is reflected back. The diffraction of the incident light beam is described with respect to FIG. 3B.

Figure 3B:
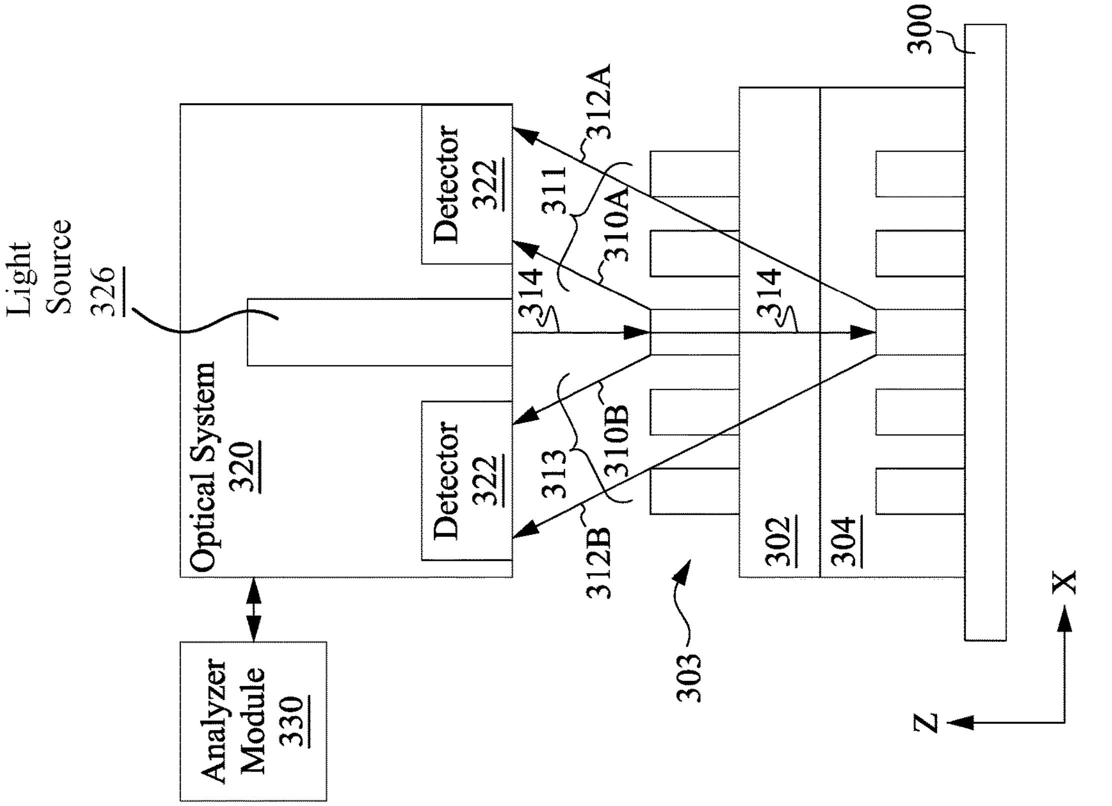
Figure 3A:
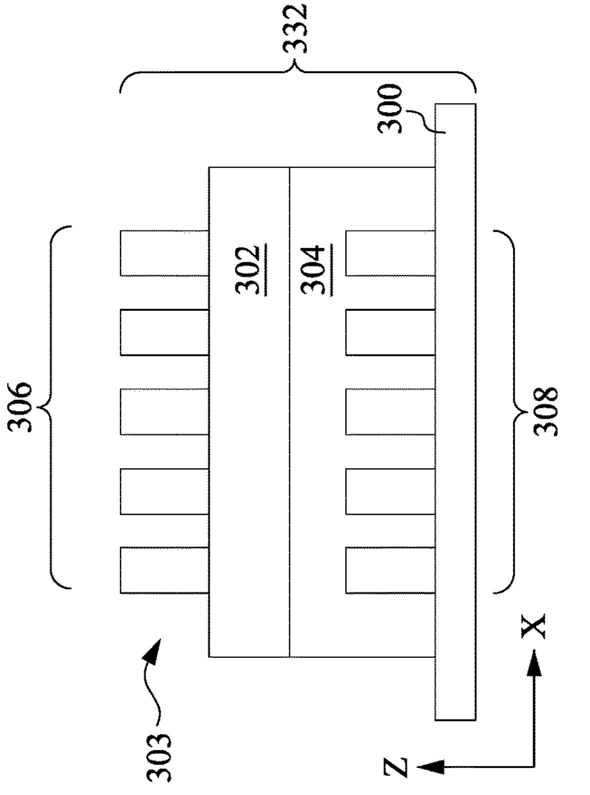

FIGS. 3A and 3B respectively illustrate cross-sectional views of a substrate 332 having two overlay measurement patterns 306 and 308. FIG. 3B includes an optical system 320 for determining an overlay error between the two overlay measurement patterns of the substrate. FIG. 3A includes a cross-sectional view of the overlay measurement pattern 308 in a first layer 304 that is disposed on top of an underlying substrate 300. In some embodiments, the overlay measurement pattern 308 along with a corresponding circuit layout pattern (not shown) is initially disposed on the underlying substrate 300 and then the first layer 304 is disposed, e.g., epitaxially grown or deposited, over the overlay measurement pattern 308. In some embodiments, a second layer 302 is disposed, e.g., epitaxially grown or deposited, over the first layer 304. In some embodiments, a resist material layer 303 is deposited over the second layer 302 and the resist material layer 303 is exposed and developed to produce an overlay measurement pattern 306 along with a corresponding layout pattern (not shown) in the resist material layer 303. Consistent with FIGS. 2A and 2B, the overlay measurement patterns 306 and 308 are distributed in the X-direction to measure an overlay error in the X-direction. In some embodiments, overlay measurement patterns are also distributed in the Y-direction to measure an overlay error in the Y-direction. In some embodiments, the second layer 302 does not exist and the overlay measurement pattern 306 is disposed on top of the first layer 304.

FIG. 3B shows an optical system 320 that includes one or more light sources 326 and one or more detectors 322. FIG. 3A further shows the overlay measurement patterns 306 and 308, the first layer 304, the second layer 302, and the resist material layer 303. In some embodiments the light source 326 of the optical system 320 transmits, e.g., radiates, an incident light beam 314 to the overlay measurement patterns 306 and 308, which have an overlap in the X-direction and in the Y-direction. In some embodiments, the overlay measurement patterns 306 and 308 have a same pitch and the light source 326, which is a coherent light source, has a wavelength comparable to the pitch of the overlay measurement patterns 306 and 308. A portion of the incident light beam 314 is diffracted and reflected from the overlay measurement pattern 306 and produces the negative and positive first order diffractions 310A and 310B respectively. A remaining portion of the incident light beam 314 passes through the overlay measurement pattern 306 and the second layer 302 and is diffracted and reflected from the overlay measurement pattern 308 and produces the negative and positive first order diffractions 312A and 312B respectively. Thus, the negative first order diffractions 311 that includes the negative first order diffractions 310A and 312A that are reflected are detected by a detector 322 and the positive first order diffractions 313 that includes the positive first order diffractions 310B and 312B that are reflected are detected by another detector 322.

An analyzer module 330 shown in FIG. 3B is coupled to the optical system 320. The analyzer module 330 receives corresponding signals of the detected negative and positive first order diffractions 311 and 313 and performs an analysis on the corresponding signals to determine a drift, e.g., a shift, between the overlay measurement patterns 308 and 306.

In some embodiments, the first layer 304 includes the overlay measurement pattern 308 as a portion of a first layout pattern. Also, the resist material layer 303 that is deposited on the second layer 302 includes the overlay measurement pattern 306 as a portion of the second layout pattern. Thus, the lateral positional difference between the overlay measurement patterns 308 and 306 indicates the lateral positional difference between the first layout pattern of the first layer 304 and the second layout pattern to be created in the second layer 302 using the resist material layer 303. In some embodiments, the top overlay measurement pattern 306 and the bottom overlay measurement pattern 308 have the same pitch and the same shape such that the number of boxes (e.g., sub-patterns of the overlay measurement pattern), the width of the boxes, and the distance between the boxes in the overlay measurement patterns 306 and 308 are the same. In some embodiments, the top overlay measurement pattern 306 and the bottom overlay measurement pattern 308 coincide such that the boxes in the overlay measurement patterns 306 and 308 coincide and there is no drift between the boxes of the top overlay measurement pattern 306 and the boxes of the bottom overlay measurement pattern 308. In some embodiments, due to the numerical aperture of the optical system 320, e.g., due to the numerical aperture of the detectors 322, the negative and positive first order diffractions 311 and 313 enter the detectors and the higher order diffractions do not enter the detectors and, thus, do not enter the optical system 320.

Figure 4A:
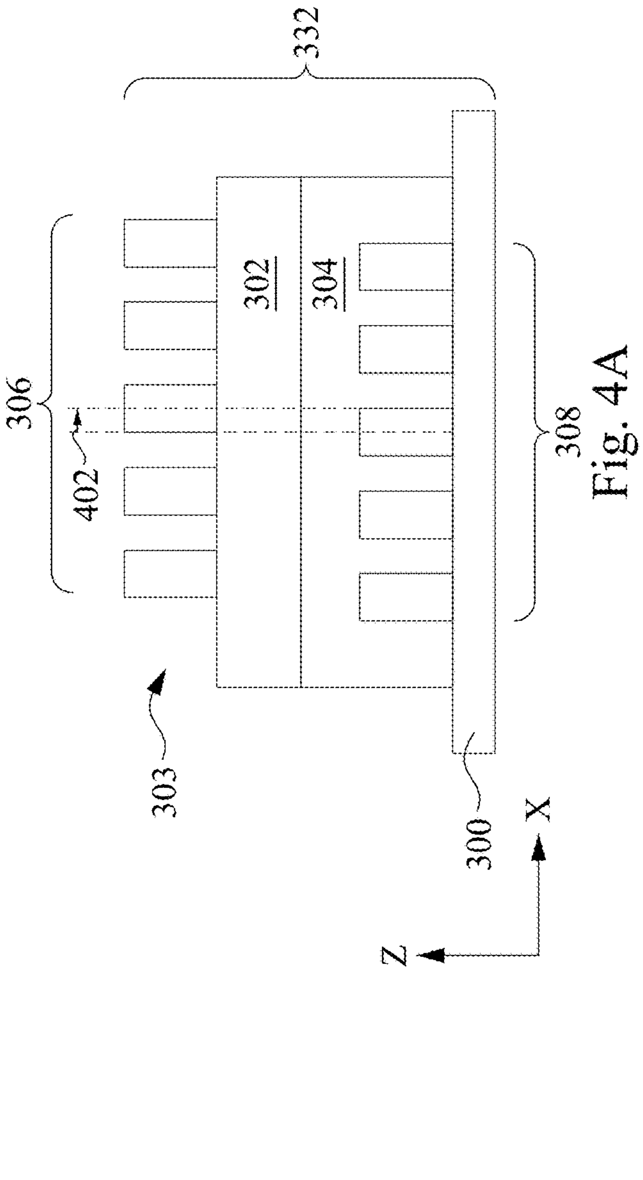
Figure 4B:
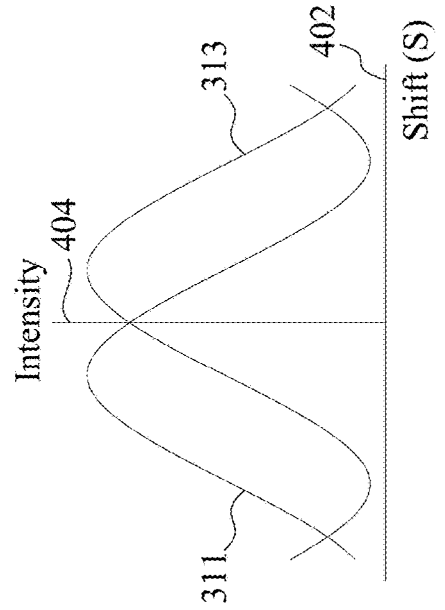
Figure 4C:
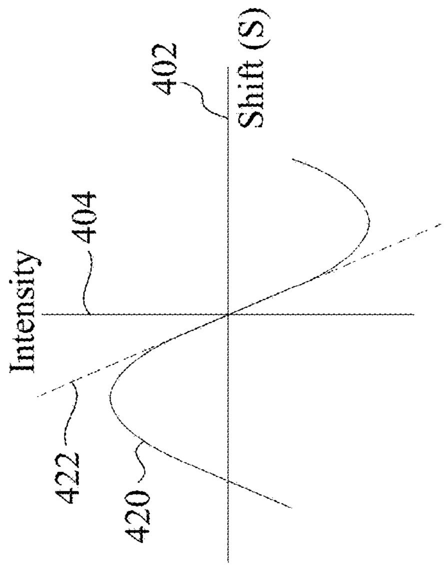

FIGS. 4A, 4B and 4C respectively illustrate a substrate 332 having two overlay measurement patterns 306 and 308 having an overlay shift (FIG. 4A), negative and positive first order diffractions 310A and 310B as a function of the overlay shift (FIG. 4B), and a difference of the first order diffracted light intensities as a function of an overlay shift distance 302 (FIG. 4C). FIG. 4A is consistent with FIG. 3A with a difference that the overlay measurement pattern 306 of the resist material layer 303 on top of the second layer 302 is shifted with respect to the overlay measurement pattern 308 by the overlay shift distance 402 in the positive X-direction. The overlay shift distance 402 is a distance between the center (e.g., the center of mass or the center of the center pattern) of the two overlay measurement patterns 306 and 308.

FIG. 4B shows light intensities of the negative and positive first order diffractions 311 and 313 as a function of the overlay shift distance 402. In some embodiments, FIG. 4B respectively shows the signals corresponding to the negative and positive detected first order diffractions 311 and 313 that are detected by the detectors 322 of the optical system 320 of FIG. 3B. In some embodiments, the analyzer module 330 receives corresponding signals of detected negative and positive first order diffractions 311 and 313 and subtracts the signal corresponding to the negative first order diffractions 311 from the signal corresponding to the positive first order diffractions 313 to generate an asymmetry (AS) function 420 (FIG. 4C). As shown in FIG. 4B, the signal corresponding to the negative first order diffractions 311 has an intensity peak in the negative region of the overlay shift distance 402 and the signal corresponding to the positive first order diffractions 313 has an intensity peak in the positive region of the overlay shift distance 402. Also, FIG. 4B shows that the signals corresponding to the detected negative and positive first order diffractions 311 and 313 are symmetric with respect to the intensity coordinate 404. Although the overlay shift distance 402 is displayed as the shift between the edges of the boxes of the overlay measurement patterns 306 and 308, the origin of the overlay measurement patterns 306 and 308 may be defined as the center of the overlay measurement patterns 306 and 308 and the overlay shift distance 402 can be defined with respect to a shift in the center of the overlay measurement patterns 306 and 308. In some embodiments, the signals corresponding to the negative first order diffraction 311 and the positive first order diffraction 313 are consistent with the signals that are detected by the detectors 322 of FIG. 3B.

FIG. 4C shows the AS function 420 as a function of the overlay shift distance 402. Because the signals corresponding to the detected negative and positive first order diffractions 311 and 313 are symmetric with respect to the intensity coordinate 404, the AS function 420 passes through the origin. In some embodiments, the AS function may be written as equation (1): where P is a pattern (grating) pitch, S is the overlay shift distance 402, and k is determined based on the light wavelength and a layer structure (e.g., thickness, refractive index, and absorption coefficient) of the first layer, the second layer, and the resist material layer. In some embodiments, when the overlay shift distance 402 is small compared to the pattern pitch P, the AS function may be written as equation (2):

$$AS = k\cdot\sin\left[\left(\frac{2\Pi}{P}\right)\cdot(S)\right] \quad \text{Eq. (1)}$$

where P is a pattern (grating) pitch, S is the overlay shift distance 402, and k is determined based on the light wavelength and a layer structure (e.g., thickness, refractive index, and absorption coefficient) of the first layer, the second layer, and the resist material layer. In some embodiments, when the overlay shift distance 402 is small compared to the pattern pitch P, the AS function may be written as equation (2):

$$AS = k\cdot\left(\frac{2\Pi}{P}\right)\cdot(S) \quad \text{Eq. (2)}$$

where $$K = k\cdot\left(\frac{2\Pi}{P}\right)$$

is the slope 422 of the AS function 320 at the origin in FIG. 4C.

Figure 5:
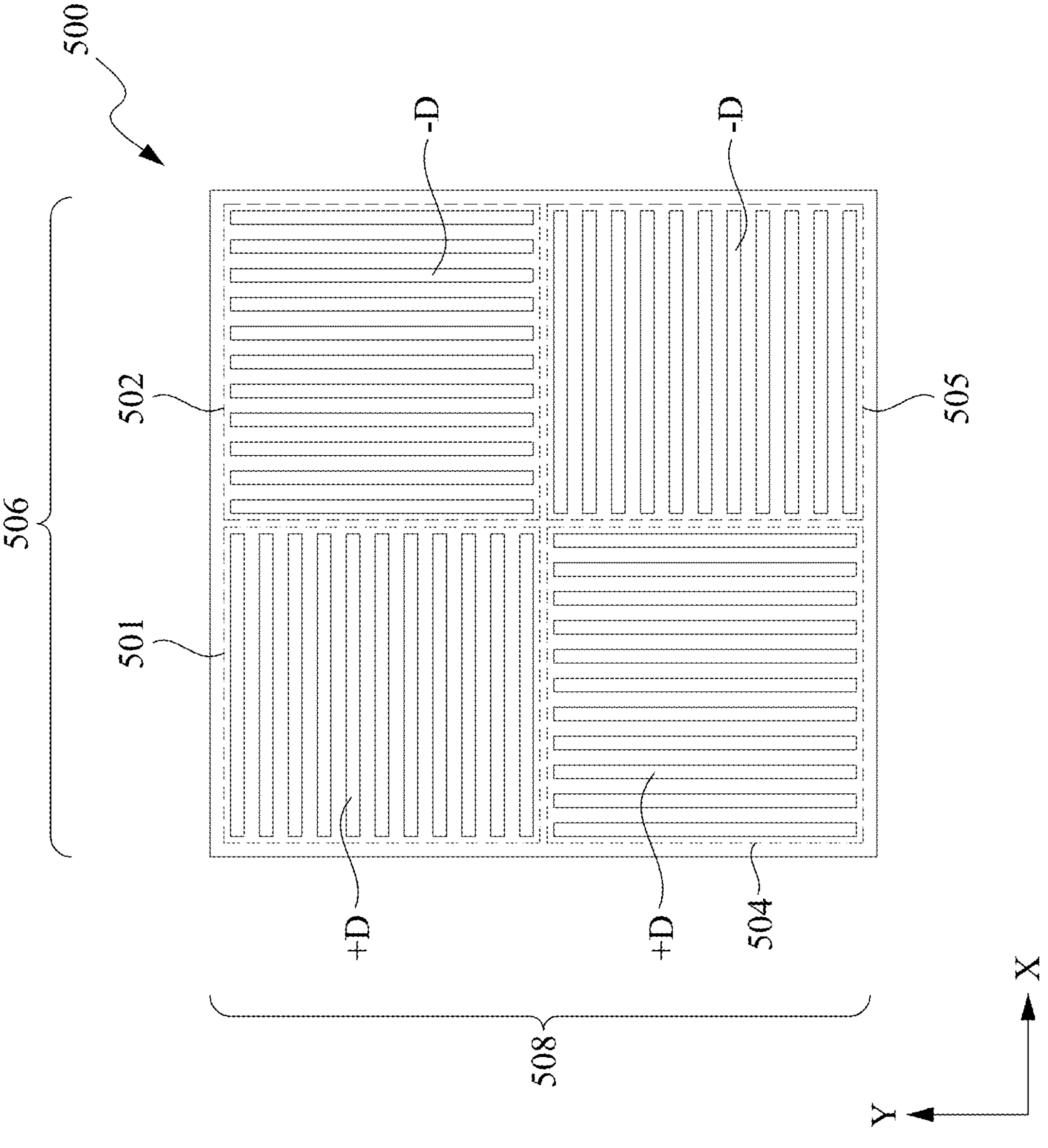

FIG. 5 illustrates an exemplary overlay measurement pattern, which may also be referred to as a "diffraction-based overlay mark" (DBO mark) or "micro-diffraction-based overlay mark" (uDBO mark). The overlay measurement pattern 500 of FIG. 5 that may be used as the overlay measurement pattern 306 of FIG. 3B and may be produced in the resist material layer 303 has four different overlay measurement patterns. In some embodiments, when the overlay measurement pattern 500 on the top coincides with the bottom overlay measurement pattern 308 of FIG. 3B, the upper right portion 502 and the lower left portion 504 of the overlay measurement pattern 400 respectively have an initial shift of −D and +D in the positive X-direction with respect to the bottom overlay measurement pattern 308. In some embodiments, the overlay measurement pattern 500 on the top is placed with an X-direction overlay error OV, e.g., overlay placement error in the X-direction, over the bottom overlay measurement pattern 308 and thus the AS function between the upper right portion 502 and the bottom overlay measurement pattern 308 becomes equation (3):

$$AS1 = k\cdot\sin\left[\left(\frac{2\Pi}{P}\right)\cdot(OV-D)\right] \quad \text{Eq. (3)}$$

which is a point on the AS function 420 of FIG. 4C with a shift S=(OV−D). The AS function between the upper right portion 502 and the bottom overlay measurement pattern 308 may be approximated as AS1=K. (OV−D), which is a point on the slope 422 of the AS function 420 of FIG. 4C with the shift S=(OV−D). Also, the AS function between the lower left portion 504 and the bottom overlay measurement pattern 308 becomes equation (4):

$$AS1 = k\cdot\sin\left[\left(\frac{2\Pi}{P}\right)\cdot(OV+D)\right] \quad \text{Eq. (4)}$$

which is a point on the AS function 420 of FIG. 4C with a shift S=(OV+D). The AS function between the lower left portion 504 and the bottom overlay measurement pattern 308 may be approximated as AS2=K. (OV+D), which is a point on the slope 422 of the AS function 420 of FIG. 4C with the shift S=(OV+D). Thus, by using the optical system 320 of FIG. 3B and measuring the detected negative and positive first order diffractions 311 and 313, the AS function value AS1 between the upper right portion 502 of the overlay measurement pattern 500 and the bottom overlay measurement pattern 308 and the AS function value AS2 between the lower left portion 504 of the overlay measurement pattern 500 and the bottom overlay measurement pattern 308 can be determined and the overlay error OV in the X-direction may be determined as:

$$OV = D\cdot\left(\frac{AS1+AS2}{AS2-AS1}\right) \quad \text{Eq. (5)}$$

In some embodiments, when the overlay measurement pattern 500 on the top coincides with the bottom overlay measurement pattern 308, the upper left portion 501 and the lower right portion 505 of the overlay measurement pattern 500 respectively have an initial shift of −D and +D in the positive Y-direction with respect to the bottom overlay measurement pattern 308. Thus, the overlay error in the Y-direction may similarly be determined.

In some embodiments, as shown in FIGS. 2A and 2B, the extent 213 of each portion of the overlay measurement pattern 500 or the overlay measurement patterns 306 and 308 is between 2,500 nm and 40,000 nm. As further illustrated in FIG. 5, extent 506 and extent 508 of the overlay measurement pattern 500 in the X direction and the Y direction, respectively, may be at least about 5 um. In some embodiments, area of the overlay measurement pattern 500, expressed as a product of the extents 506, 508 may be at least about 12 um×12 um, at least about 16 um×16 um, or at least about 20 um×20 um. A CD of the sub-patterns, e.g., the width 234 of the dark strips 214 (see FIG. 2B), of each portion of the overlay measurement pattern 500 or the overlay measurement patterns 306 and 308 is between 10 nm and 800 nm. A pitch between the sub-patterns, e.g., the pitch 232 (see FIG. 2B), of each portion of the overlay measurement pattern 500 or the overlay measurement patterns 306 and 308 is between about 15 nm and about 900 nm in some embodiments.

Figure 6:
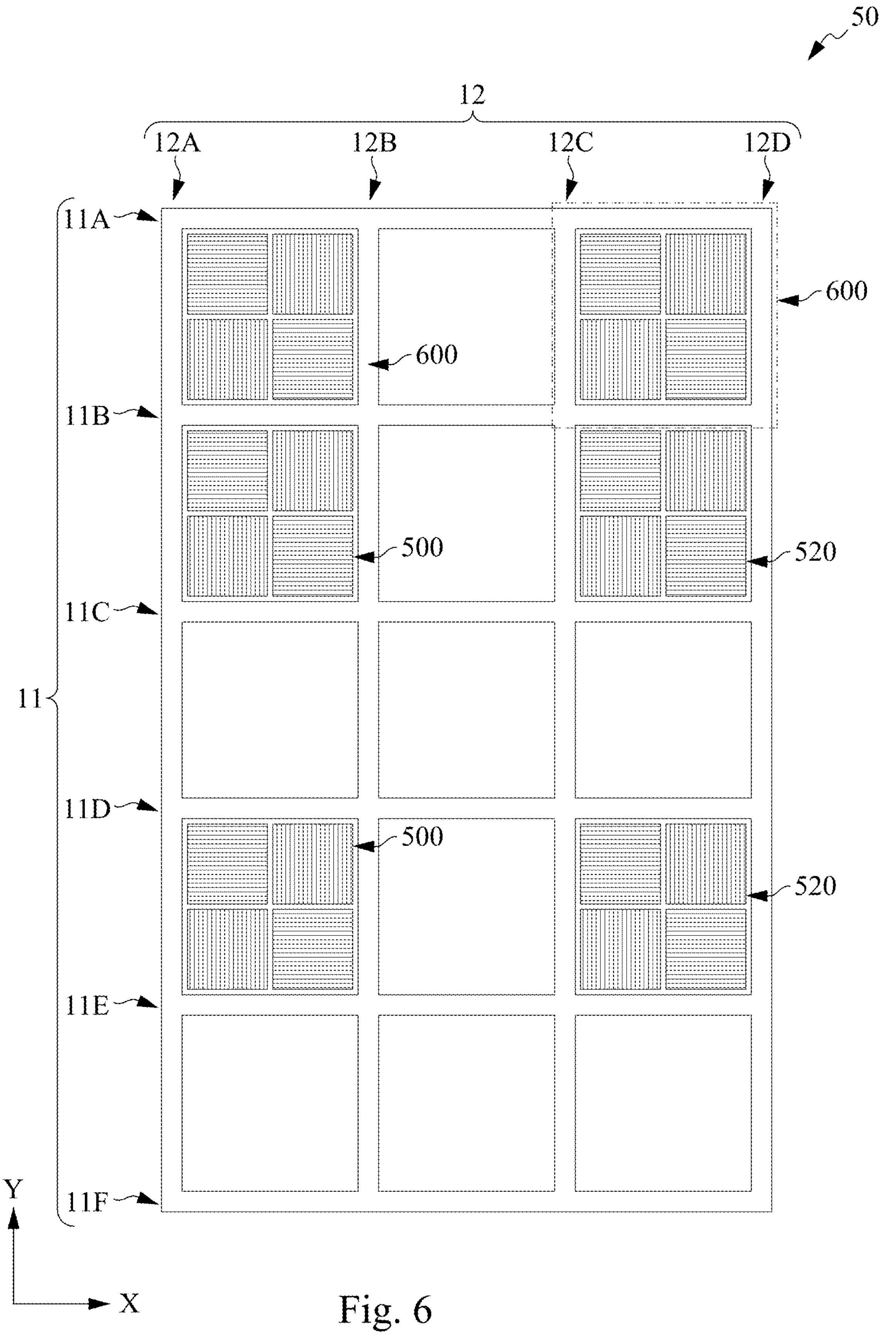
FIGS. 6-7F are views illustrating hybrid DBO marks according to various aspects of the present disclosure.

FIG. 6 is a plan view of an alignment region 50 of a substrate, e.g., the substrate 332 of FIGS. 3A and 4A, in accordance with various embodiments. In some embodiments, the alignment region 50 is present in a scribe line, or "test line," of a semiconductor wafer. During fabrication of at least two individual integrated circuit die on a single semiconductor wafer, a scribe line may be an area in the semiconductor wafer which is used to separate individual die at the end of wafer processing. The area may contain features which assist in the manufacturing process but are not present in a final product. Generally, width of the scribe line is large enough to allow separation of the die by cutting or breaking, without damage to the die. In some embodiments, the alignment region 50 is present in one or more die of the at least two integrated circuit die on the semiconductor wafer.

As shown in FIG. 6, the alignment region includes various DBO marks 500, 520, 600. The plan view of the alignment region 50 illustrates features in two material layers. A first material layer may be a previous material layer, and a second material layer may be a current material layer. As such, the first material layer may be over the previous material layer (relative to the substrate). In some embodiments, the current material layer is a photoresist layer, such as the resist material layer 303 (FIG. 3A), and the previous material layer is a metallization layer, such as the first layer 304 (FIG. 3A). In some embodiments, the DBO marks 500 are in the previous material layer, and the DBO marks 520 are in the current material layer. In some embodiments, the DBO marks 600 are in both the previous material layer and the current material layer. The DBO marks 600 may further include calibration marks 60C, 60P, which are further described with reference to FIGS. 7A-7C. As such, the DBO marks 600 may also be referred to as hybrid overlay alignment marks, or hybrid DBO marks. The DBO marks 500 may be upper DBO marks in terms of the previous material layer, and may be unused lower DBO marks relative to the current material layer. As such, no further DBO mark overlies the DBO marks 500 in the current layer. The DBO marks 520 may be lower DBO marks in terms of the current material layer, to be used in conjunction with an overlying upper DBO mark to be fabricated in a subsequent material layer. The DBO marks 600 are active DBO marks to be used in aligning the current material layer to the previous material layer. Each of the DBO marks 500, 520 may have substantially the same configurations (width, length, critical dimension, pitch, spacing, and the like), such as is shown in FIG. 5. The DBO marks 600 may include upper DBO marks and lower DBO marks each having substantially the same configurations (width, length, critical dimension, pitch, spacing, and the like) as the DBO mark 500 shown in FIG. 5.

Horizontal lines 11A-11F, collectively referred to as horizontal lines 11, may extend along the X direction, and be arranged along the Y direction vertically between and vertically framing the DBO marks 500, 520, 600. Vertical lines 12A-12D may extend along the Y direction, and be arranged along the X direction laterally between and laterally framing the DBO marks 500, 520, 600. In some embodiments, the horizontal and vertical lines 11, 12 are or comprise the material of the current material layer, e.g., photoresist, a semiconductor material, metal, dielectric, or the like.

Figure 7A:
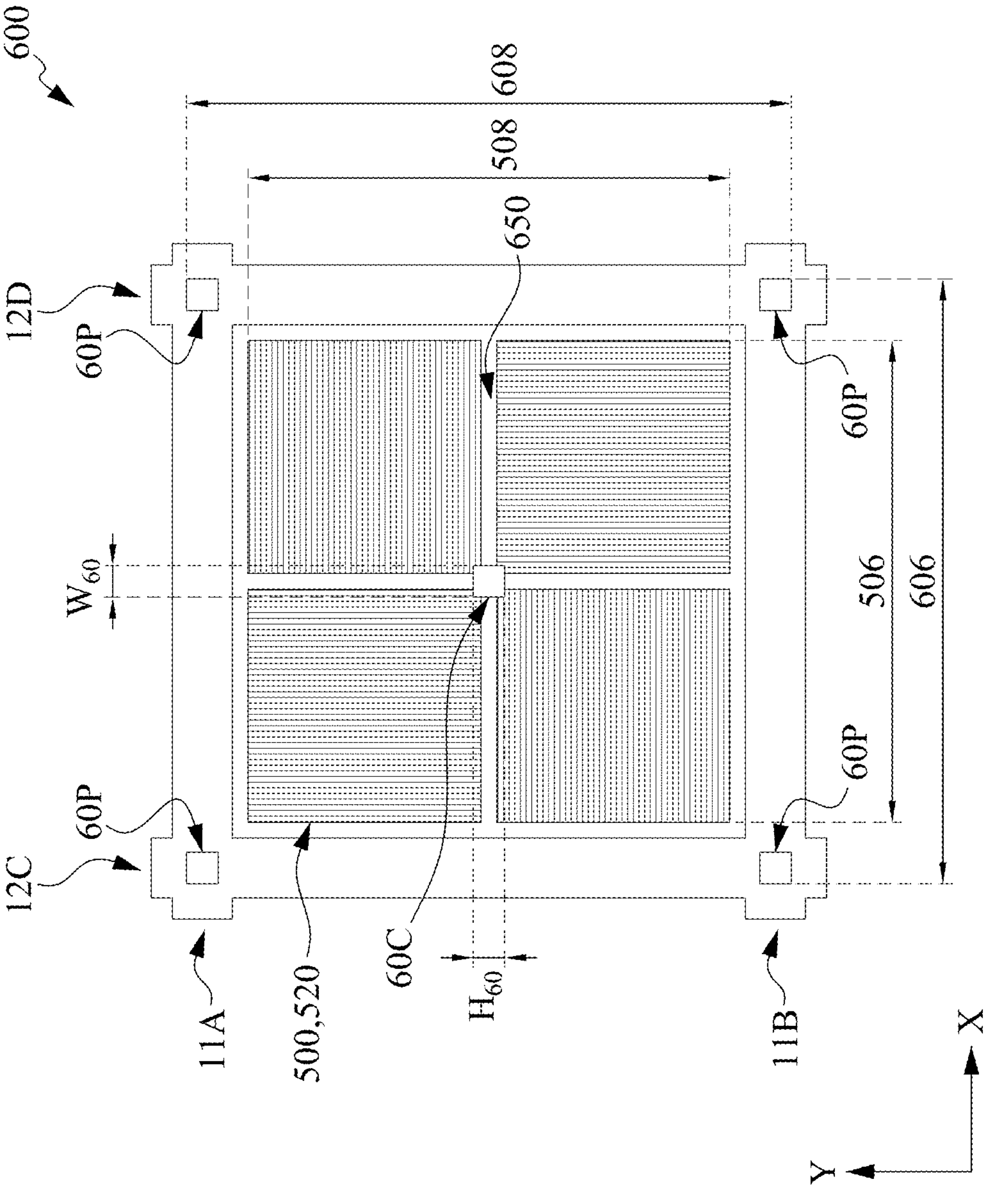
Figure 7B:
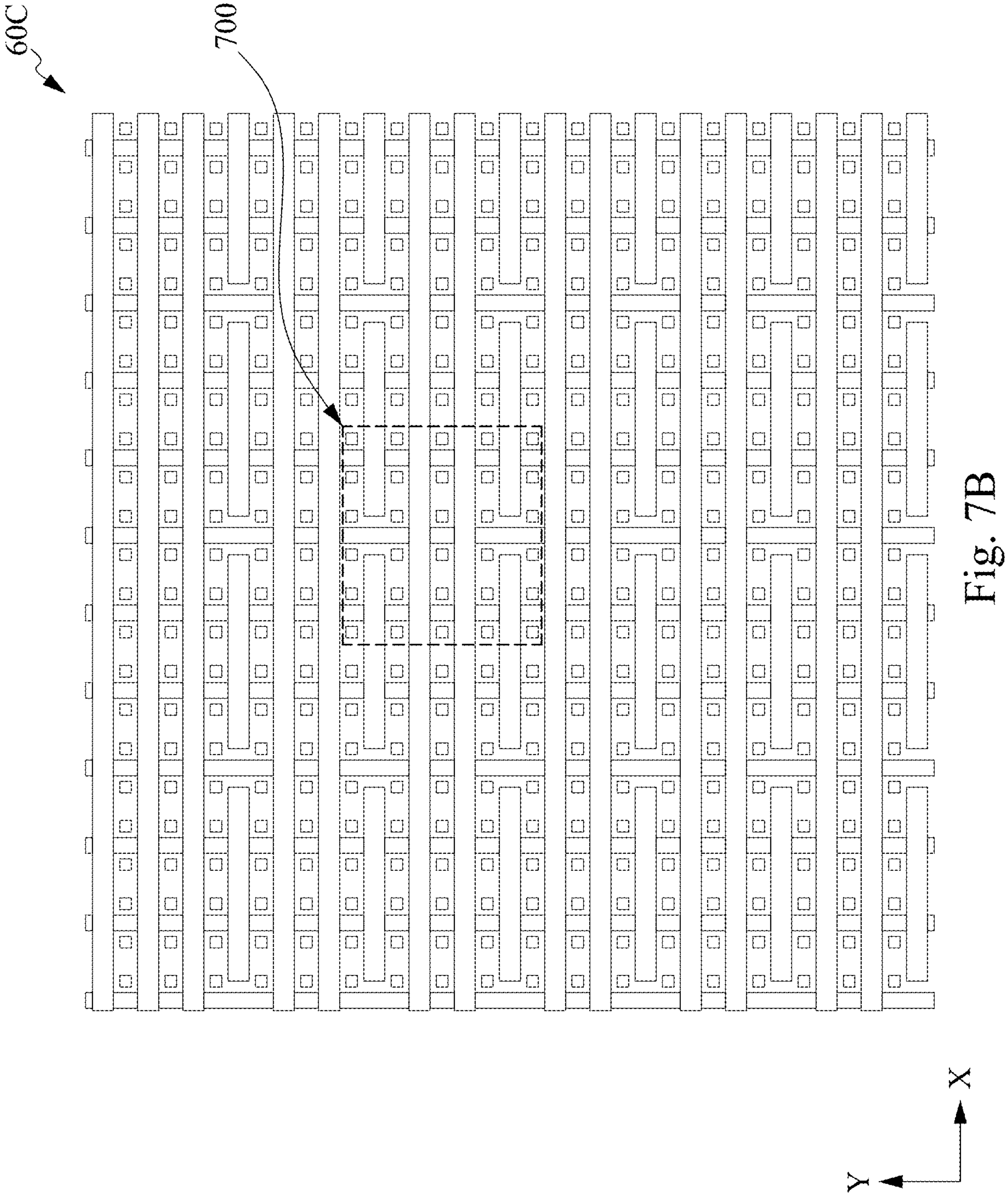
Figure 7C:
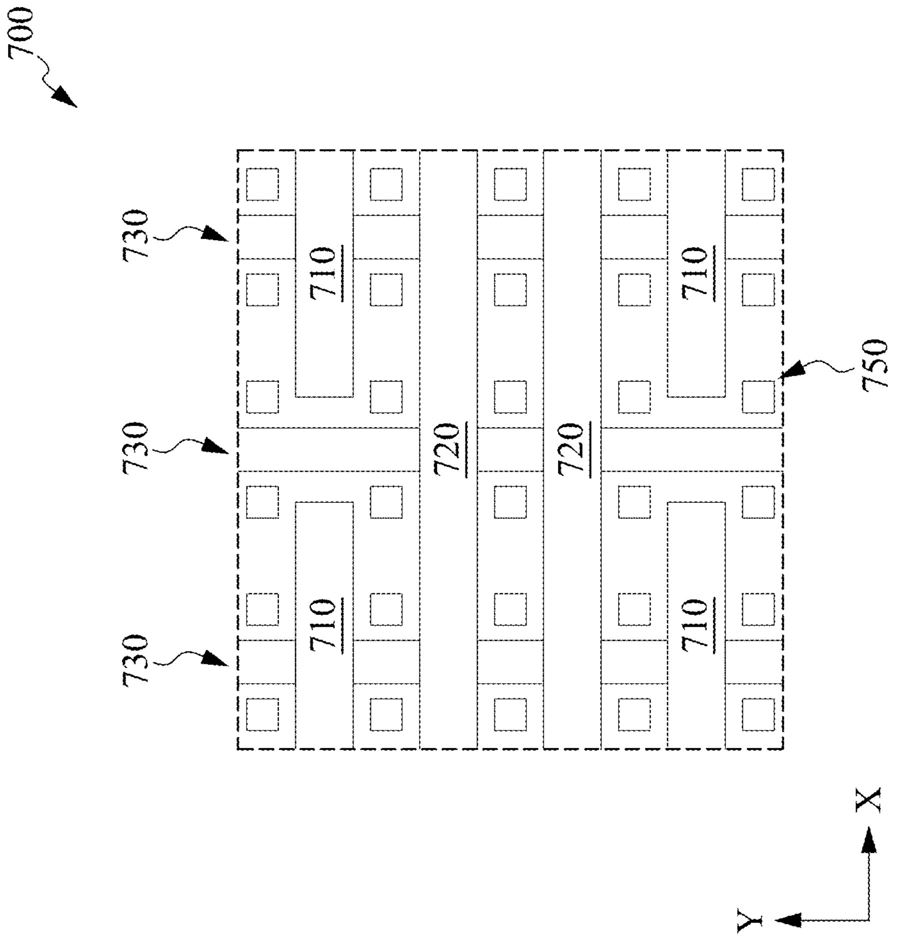

FIGS. 7A, 7B, 7C are plan views of the DBO mark 600 outlined in FIG. 6, a calibration mark 60C outlined in FIG. 7A, and a region 700 of the calibration mark 60C highlighted in FIG. 7B, respectively.

In FIG. 7A, as mentioned briefly in the description with reference to FIG. 6, in addition to the DBO patterns 500, 520, which may each include the portions 501, 502, 504, 505 illustrated in FIG. 5, the hybrid DBO mark 600 may further include calibration marks 60C, 60P. The calibration mark 60C may be a central calibration mark located in a space 650 (or "lane") between the portions 501, 502, 504, 505 of the DBO patterns 500, 520. The calibration marks 60P may be peripheral calibration marks located at intersections of the horizontal and vertical lines 11, 12, on the periphery of the DBO patterns 500, 520. In the specific example of FIG. 7A, peripheral calibration marks 60P are located at the intersections of horizontal and vertical lines 11A and 12C, 11A and 12D, 11B and 12C, and 11B and 12D, respectively. Further configurations of the calibration marks 60C, 60P are described with reference to FIGS. 7D-7F.

As illustrated in FIG. 7A, dimensions of the calibration marks 60C, 60P may be quite small relative to overall dimensions of the DBO patterns 500, 520. In some embodiments, dimensions $W_{60}$, $H_{60}$ of the calibration marks 60C, 60P in the X direction and the Y direction, respectively, may be less than about 5 um×5 um. In some embodiments, the dimensions $W_{60}$, $H_{60}$ of the calibration marks 60C, 60P may be less than about 2 um×2 um, or less than about 1 um×1 um. As a ratio, the area (e.g., $W_{60} \times H_{60}$) of each calibration mark 60C, 60P may occupy less than about $1/12^{th}$ the area of each of the DBO patterns 500, 520. In some embodiments, the area of each calibration mark 60C, 60P occupies less than about $1/100^{th}$ the area of each of the DBO patterns 500, 520. In some embodiments, the area of each calibration mark 60C, 60P occupies less than about $1/400^{th}$ the area of each of the DBO patterns 500, 520. Generally, the area of each DBO pattern 500, 520 may be equal to the product of the extents 506, 508. The area of each calibration mark 60C/60P occupying more than about $1/12^{th}$ of the area of the DBO pattern 500, 520 may introduce topology imbalance issues, as described previously. When a ratio less than about $1/400^{th}$ between the area of each calibration mark 60C, 60P and the area of the DBO pattern 500, 520 is present, generally this indicates the DBO pattern 500, 520 occupies a large area, which may not be desirable in consideration of mask and/or lens fingerprints.

Further to FIG. 7A, position of the calibration marks 60C, 60P may be proximal position of the DBO patterns 500, 520. The "position" of the DBO patterns 500, 520 may be a center of the DBO patterns 500, 520 as calculated by center of mass, center of extents 506, 508, or the like. Also illustrated in FIG. 7A, extent 606 is a width of the hybrid DBO mark 600 along the X direction, from a leftmost side of the peripheral calibration marks 60P to a rightmost side of the peripheral calibration marks 60P. Extent 608 is a height of the hybrid DBO mark 600 along the Y direction, from a topmost side of the peripheral calibration marks 60P to a bottommost side of the peripheral calibration marks 60P. As such, the "position" of the hybrid DBO mark 600 including the peripheral calibration marks 60P may be a center of the hybrid DBO mark 600 as calculated by center of mass of the DBO patterns 500, 520 plus the calibration marks 60C, 60P. The center of the hybrid DBO mark 600 may be calculated as center of the extents 606, 608.

The position of the calibration marks 60C, 60P may be determined collectively for all calibration marks 60C, 60P associated with the hybrid DBO mark 600 in the embodiment. For example, the position of the calibration marks 60C, 60P may be calculated by center of mass, center of extents, or the like. If the calibration marks 60C, 60P are arranged substantially symmetrically with reference to the center of the DBO patterns 500, 520, then the position of the calibration marks 60C, 60P may be substantially the same as the position of the DBO patterns 500, 520. In some embodiments, distance between the position of the calibration marks 60C, 60P and position of the DBO patterns 500, 520 is distance between the centers of the calibration marks 60C, 60P and the DBO patterns 500, 520. In some embodiments, the distance is less than about 1 um. In some embodiments, the distance may be less than about 0.5 um, less than about 0.1 um, less than about 0.01 um, or less than about 0.001 um. In some embodiments, a ratio between the distance and the area of either of the DBO patterns 500, 520 may be determined. For example, the ratio may be between the distance (separation) and square root of the area. In some embodiments, the ratio may be no more than about 6%, no more than about 8%, or no more than about 10%. As such, when dimensions 506, 508 of the DBO patterns 500, 520 are about 12 um×12 um, the calibration marks 60C, 60P are within 1.2 um of the DBO patterns 500, 520. Embodiments are described above in terms of the position of the calibration marks 60C, 60P collectively, however the distance may also be determined as maximum distance between any individual calibration mark 60C, 60P and any surface (e.g., sidewall) of the DBO patterns 500, 520 in some embodiments, and the ratio similarly may be calculated using the maximum distance.

FIG. 7B is a plan view showing at least two material layers of the calibration mark 60C in accordance with various embodiments. FIG. 7C is a detailed view of a region 700 of the calibration mark 60C of FIG. 7B. In some embodiments, the calibration marks 60P may have the same or similar configuration to that shown in FIGS. 7B-7C. The calibration mark 60C includes device-like features similar to device features that are present in the integrated circuit under fabrication. As shown in FIG. 7C, active regions 710, 720 extend in the X direction, and are arranged in the Y direction. The active regions 720 extend across the extent of the calibration mark 60C, and the active regions 710 are segments that do not extend fully across the extent of the calibration mark 60C. In some embodiments, the active regions 710, 720 are source/drain epitaxial or implantation regions including silicon and another material, such as phosphorous, boron, germanium, or the like. In some embodiments, the active regions 710, 720 are formed in the same material layer as the DBO mark 520. In some embodiments, pitch of the active regions 710, 720 along the Y axis is less than about 300 nm. In some embodiments, the pitch is less than about 200 nm. In some embodiments, the pitch is less than about 100 nm. The pitch being greater than 300 nm may not provide sufficient accuracy when calibrating the DBO patterns 500, 520, 600.

The calibration mark 60C further includes gate regions 730, which may be or comprise polysilicon or a metal, such as W, Co, Ru, Cu, Ti, Al, or the like. The gate regions 730 extend along the Y direction (perpendicular to the active regions 710, 720), and are arranged along the X direction. In some embodiments, the gate regions 730 are formed in the same material layer as the DBO mark 500. In some embodiments, the active regions 710, 720 partially land on the gate regions 730. In some embodiments, the gate regions 730 partially land on the active regions 710, 720. In some embodiments, pitch of the gate regions 730 along the X axis is less than about 300 nm. In some embodiments, the pitch is less than about 200 nm. In some embodiments, the pitch is less than about 100 nm. The pitch being greater than 300 nm may not provide sufficient accuracy when calibrating the DBO patterns 500, 520, 600.

The calibration mark 60C further includes via regions 750, which may be or comprise a metal, such as W, Co, Ru, Cu, Ti, Al, or the like. In some embodiments, the via regions 750 are formed laterally between (X-direction and Y-direction) the active regions 710, 720 and the gate regions 730. In some embodiments, the via regions 750 have similar pitch to the active regions 710, 720 and/or the gate regions 730. In some embodiments, the via regions 750 are formed in the same material layer as the DBO mark 500 and/or the DBO mark 520. In some embodiments, the via regions 750 do not overlap or land on the active regions 710, 720, the gate regions 730, or other via regions 750. In some embodiments, the via regions 750 land fully on underlying via regions 750.

Embodiments of the various regions 710, 720, 730, 750 of the calibration mark 60C are described in the context of active regions 710, 720, gate regions 730, and via regions 750. In other embodiments, the regions 710, 720, 730, 750 may include materials, shapes, and patterns different from those illustrated in, and described with reference to, FIG. 7C. For example, the hybrid DBO mark 600 may be formed in an interconnect layer including metallization regions in a dielectric layer. Materials, shapes, and patterns of the regions 710, 720, 730, 750 may be configured in different ways suitable to different lithography processes. In some embodiments, a first pattern may include first regions in a first material layer, and a second pattern may include second regions in a second material layer immediately over the first material layer. In some embodiments, the first pattern and the second pattern are non-overlapping. In some embodiments, the first pattern and the second pattern are partially overlapping. In some embodiments, the first pattern and the second pattern are fully overlapping, such that the upper-layer pattern (e.g., the second pattern) lands fully on the lower-layer pattern (e.g., the first pattern). In some embodiments, the first and second regions may include any of vias, lines, or other suitable shapes.

Figure 7D:
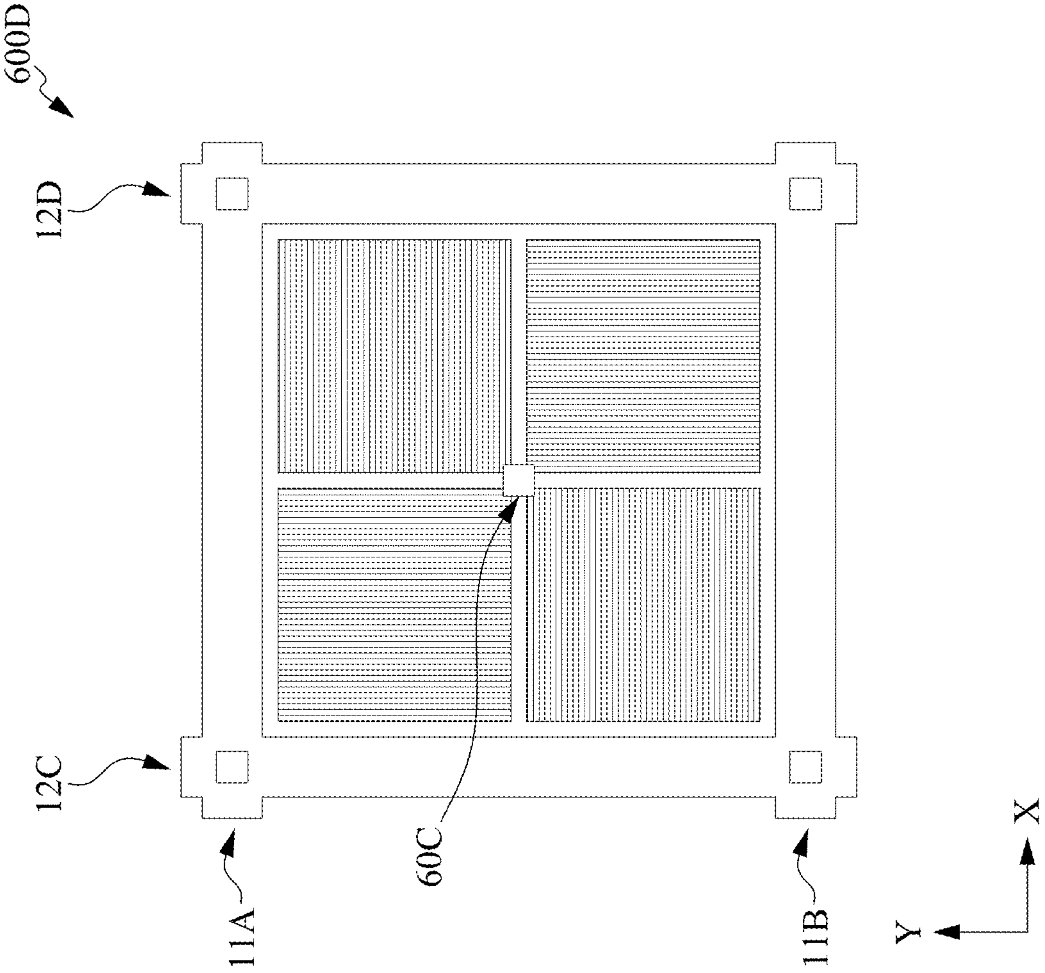
Figure 7E:
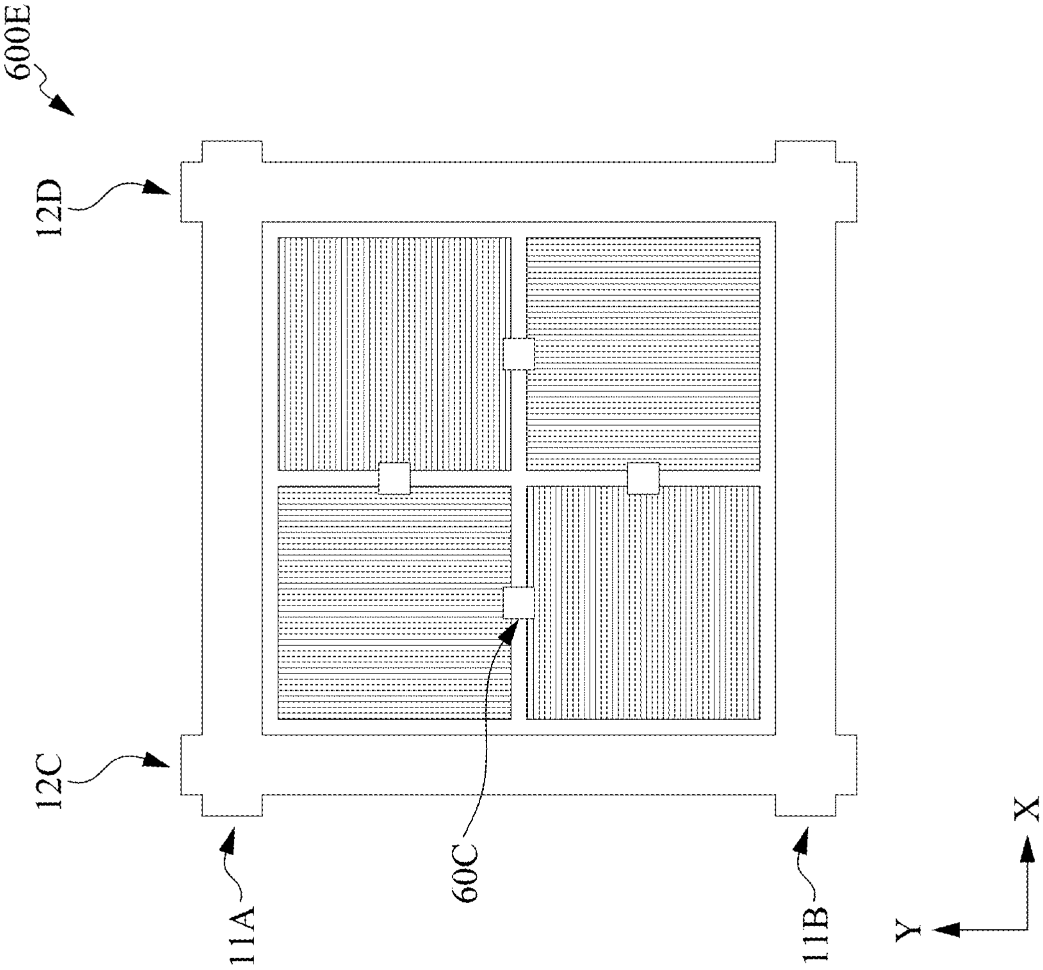
Figure 7F:
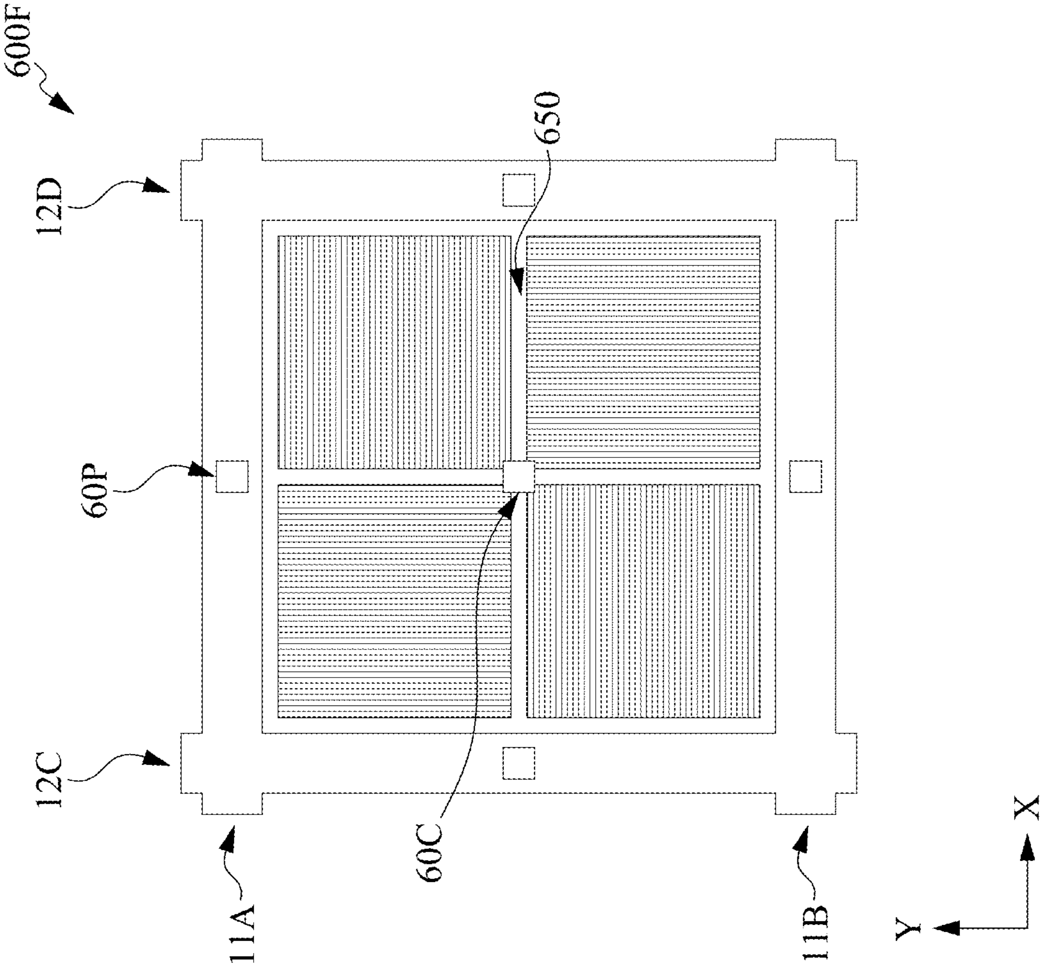

FIGS. 7D, 7E, 7F are plan views of various hybrid DBO marks 600D-600F in accordance with various embodiments.

In FIG. 7D, only one calibration mark 60C is included in the embodiment, and the hybrid DBO mark 600D is substantially free of peripheral calibration marks 60P. The calibration mark 60C is located substantially at the center of the DBO marks 500, 520.

In FIG. 7E, the hybrid DBO mark 600E is substantially free of peripheral calibration marks 60P, and includes at least four calibration marks 60C between the portions 501, 502, 504, 505 of the DBO marks 500, 520. In some embodiments, the calibration marks 60C are substantially equidistant from the center of the DBO marks 500, 520. In some embodiments, the calibration marks 60C are symmetrical around the center of the DBO marks 500, 520.

In FIG. 7E, the intersections of the horizontal and vertical lines 11, 12 are substantially free of the peripheral calibration marks 60P, and at least four peripheral calibration marks 60P are positioned on the horizontal and vertical lines 11, 12. In some embodiments, the peripheral calibration marks 60P are substantially aligned with the spaces 650 of the DBO marks 500, 520. In some embodiments, the hybrid DBO mark 600F further includes the calibration mark 60C.

FIGS. 7A, 7D-7F illustrate various spatial configurations of the calibration marks 60C, 60P relative to the DBO marks 500, 520. In some embodiments, the configurations of the calibration marks 60C, 60P of the hybrid DBO marks 600, 600D-600F may be combined.

The hybrid DBO marks 600, 600D-600F may be formed in scribe lines of a wafer including a plurality of die. In some embodiments, the hybrid DBO mark 600, 600D-600F may be formed in one or more of the die. In some embodiments, the calibration marks 60P are formed in one or more of the die, and the DBO marks 500, 520 are formed in the scribe line.

Figure 8:
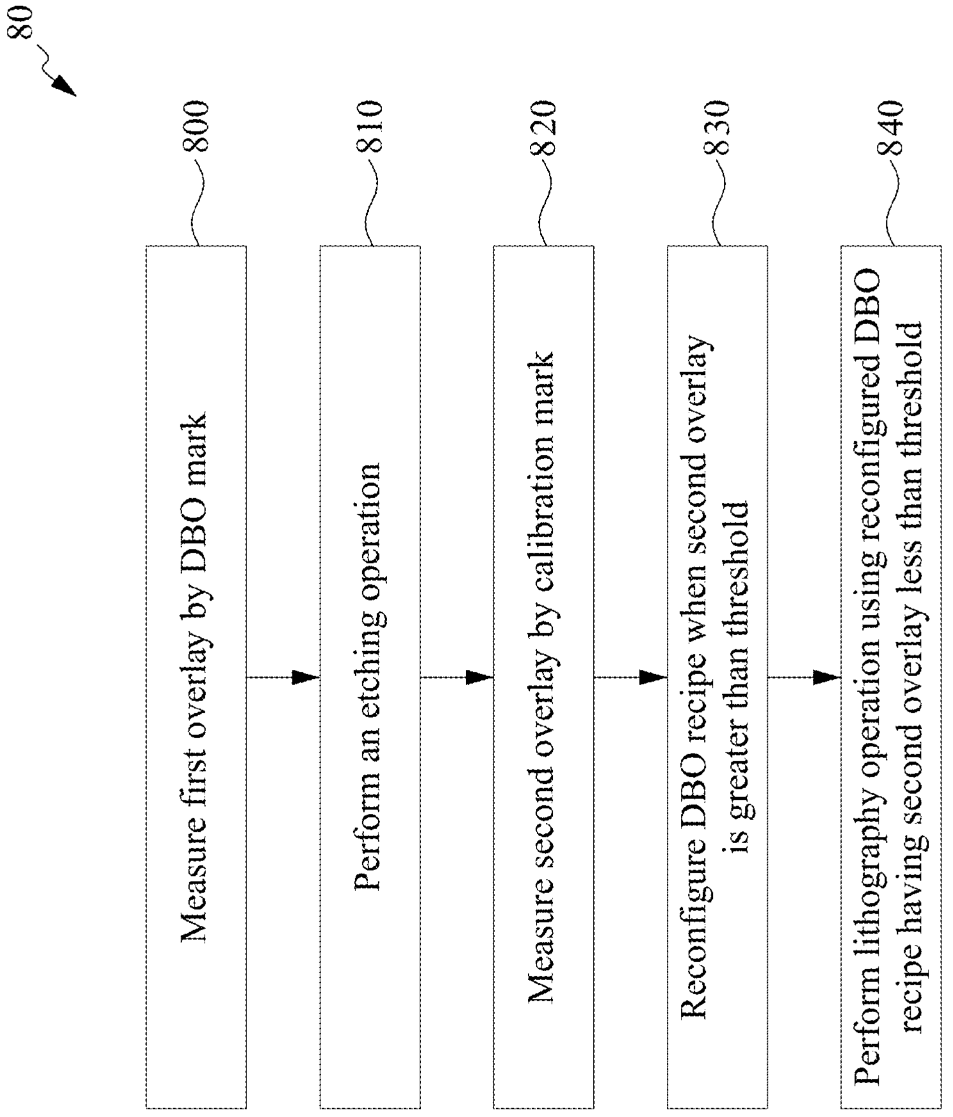
FIG. 8 is a view illustrating a method of aligning layers of a semiconductor device according to various aspects of the present disclosure.

FIG. 8 is a flowchart of a method 80 for aligning semiconductor layers using the hybrid DBO mark 600, 600D-600F in accordance with various embodiments. The method 80 is described in terms of the hybrid DBO mark 600, but may also be used with the hybrid DBO marks 600D-600F. Method 80 is merely an example and is not intended to limit the present disclosure to what is explicitly illustrated in method 80. Additional steps can be provided before, during and after the method 80, and some steps described can be replaced, eliminated, performed simultaneously, or moved around for additional embodiments of the methods.

In operation 800, a first overlay of a first material layer over a second material layer is measured by the DBO marks 500, 520 of the hybrid DBO mark 600. The measurement of operation 800 may be performed as described with reference to FIGS. 3A-4C. In some embodiments, the measurement of operation 800 is performed in an after-deposition inspection ("ADI") process. For example, the ADI process may be performed on a photoresist layer, such as the layer 303 of FIG. 3B, using the optical system 320 and the analyzer module 330. In some embodiments, the ADI process is performed on a patterned hard mask layer.

Following operation 800, in operation 810, an etching process is performed. For example, exposed portions of the layer 302 of FIG. 3B may be removed by an anisotropic etching process, and the photoresist layer 303 may be removed by ashing or another suitable process.

Following the etching process performed in operation 810, a second overlay is measured 820 using the calibration marks 60C, 60P. In some embodiments, the operation 820 is performed by an electron-based microscope, such as a scanning electron microscope (SEM) or other suitable microscope. The second overlay is generally much more precise than the first overlay. In some embodiments, the operation 820 is performed during an after-etch inspection and/or an after-polish inspection. In some embodiments, the second overlay is measured by averaging overlays of the calibration marks 60C, 60P.

Following measurement of the second overlay in operation 820, a DBO recipe is reconfigured when the second overlay is greater than a threshold 830. In some embodiments, the threshold is a distance, such as 0.1 nm, 1 nm, 2 nm, or the like. In some embodiments, the threshold is a percentage of a smallest feature dimension (sometimes referred to as "CD"), such as 20%, 10%, 5%, or the like. In some embodiments, the operations 800-830 are repeated until the second overlay is less than the threshold.

In operation 840, a lithography operation is performed using the reconfigured DBO recipe having the second overlay less than the threshold. In some embodiments, the operations 800-830 may be collectively performed on at least one first wafer, and the operation 840 is performed on a second wafer different from the first wafer. In some embodiments, the first wafer is part of a pilot (or trial) manufacturing process, and the second wafer is part of a production manufacturing process. For example, yield in the pilot manufacturing process is generally substantially lower than yield in the production manufacturing process. In some embodiments, the operations 800-830 are performed periodically during the production manufacturing process to recalibrate alignment of the DBO mark 600 to maintain the second overlay within the threshold. For example, the operations 800-830 may be performed after every 100 wafers, 1000 wafers, 10,000 wafers, or the like.

Embodiments may provide advantages. The hybrid DBO mark 600 includes the DBO mark 500, 520 and the device-like calibration mark 60C, 60P in close proximity to the DBO mark 500, 520. By locating the calibration mark 60C, 60P at a center region of the DBO mark 500, 520, distance therebetween is dramatically reduced, and overlay accuracy is increased. Configuring the calibration mark 60C, 60P to have greatly reduced area, and locating the calibration mark symmetrically in and/or around the DBO mark 500, 520 reduces topography impact during DBO measurement, again increasing overlay accuracy. The device-like calibration mark 60C, 60P also exhibits overlay behavior that is similar to the semiconductor devices being fabricated due to reduced lens aberration and similar process capability.

In accordance with at least one embodiment, a device comprises a diffraction-based overlay (DBO) mark at a first position, and a first calibration mark at a second position less than about 1 micrometer from the first position.

In accordance with at least one embodiment, a device comprises a diffraction-based overlay (DBO) mark having an upper-layer pattern disposed over a lower-layer pattern, and having smallest dimension greater than about 5 micrometers, and a calibration mark having an upper-layer pattern disposed over a lower-layer pattern, positioned substantially at a center of the DBO mark, and having smallest dimension less than about $1/5^{th}$ the size of the smallest dimension of the DBO mark.

In accordance with at least one embodiment, a method comprises: measuring a first overlay between a first material layer and a second material layer by a diffraction-based overlay (DBO) mark; performing an etching operation using the first material layer; measuring a second overlay by a calibration mark less than 1 micrometer distant the center of the DBO mark following the etching operation; forming a second DBO recipe by reconfiguring a first DBO recipe when the second overlay is greater than a threshold; and performing a lithography operation using the second DBO recipe having the second overlay less than the threshold.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
- a diffraction-based overlay (DBO) mark including:
  - an upper left portion, a lower right portion, a lower left portion, and an upper right portion, the upper left portion having an upper left corner, the lower right portion having a lower right corner, the lower left portion including a lower left corner, and the upper right portion includes an upper right corner;
  - a first lane extending in a first direction between the upper left portion and the upper right portion, and the first lane extending in the first direction between the lower left portion and the lower right portion;
  - a second lane extending in a second direction between the upper left portion and the lower left portion, and the second lane extending in the second direction between the upper right portion and the lower right portion; and
  - a center defined at a location at which the first lane and the second lane intersect with each other, the center is surrounded by a plurality of first corners of the upper left portion, the lower left portion, the upper right portion, and the lower right portion, each respective first corner of the plurality of first corners is opposite to a corresponding one of the upper left portion, the lower left portion, the upper right portion, and the lower right portion;
  - a first calibration mark at the center, and the first calibration mark is in close proximity to the plurality of first corners, the first calibration mark includes:
    - a plurality of first active regions that are separate and distinct from each other, each respective first active region extends partially across the first calibration mark in the second direction;
    - a plurality of second active regions that are separate and distinct from each other, each respective second active region extends fully across the first calibration mark in the second direction, wherein a pair of second active regions is between a first group of the plurality of first active regions and a second group of the plurality of first active regions; and
    - a plurality of first via regions that are spaced apart from the plurality of first active regions and the plurality of second active regions.

2. The device of claim 1, wherein the first calibration mark is less than 1 micrometer from the upper left portion, the upper right portion, the lower left portion, and the lower right portion of the DBO mark.

3. The device of claim 1, wherein the DBO mark further includes a plurality of second calibration marks, each respective second calibration mark of the plurality of second calibration marks is in close proximity a corresponding second corner of a plurality of second corners of the upper left portion, the upper right portion, the lower left portion, and the lower right portion of the DBO mark, the plurality of second corners being corners spaced furthest away from the center.

4. The device of claim 3, wherein each respective second calibration mark of the plurality of calibration marks includes:
- a plurality of third active regions that are separate and distinct from each other, each respective third active region extends partially across the second calibration mark in the second direction;
- a plurality of fourth active regions that are separate and distinct from each other, each respective fourth active region extends fully across the second calibration mark in the second direction, wherein a pair of fourth active regions is between a first group of the plurality of third active regions and a second group of the plurality of third active regions; and
- a plurality of second via regions that are spaced apart from the plurality of third active regions and the plurality of fourth active regions.

5. The device of claim 4, wherein the DBO mark further includes a plurality of lines including:
- a first line extending in the first direction;
- a second line extending in the first direction, and the second line being opposite to the first line about the upper left portion, the upper right portion, the lower left portion, and the lower right portion of the DBO mark;
- a third line extending in the second direction, the third line extending from the first line to the second line;
- a fourth line extending in the second direction, the fourth line extending from the first line to the second line, and the fourth line being opposite to the third line about the upper left portion, the upper right portion, the lower left portion, and the lower right portion of the DBO mark.

6. The device of claim 5, wherein the plurality of second calibration marks are positioned at a plurality of intersections regions at which the plurality of lines intersect each other.

7. The device of claim 6, wherein the plurality of intersection regions includes:
- a first intersection region at which the first line intersects the third line;
- a second intersection region at which the first line intersects the fourth line;
- a third intersection region at which the second line intersects the third line; and
- a fourth intersection region at which the second line intersects the fourth line.

8. The device of claim 1, wherein a ratio of size of the first calibration mark to a size of the DBO mark is less than $1/12$.

9. The device of claim 1, wherein the first calibration mark is less than 0.01 micrometers from the upper left portion, the upper right portion, the lower left portion, and the lower right portion of the DBO mark.

10. A device, comprising:
- a diffraction-based overlay (DBO) mark including:
  - an array of rectangular shaped portions, the array of rectangular shaped portions include a first rectangular shaped portion, a second rectangular shaped portion, a third rectangular shaped portion, and a fourth rectangular shaped portion;
  - a first lane extends in a first direction, the first lane extends between the first rectangular shaped portion and the second rectangular shaped portion, and the first lane extends between the third rectangular shaped portion and the fourth rectangular shaped portion;
  - a second lane extends in a second direction perpendicular to the first direction, the second lane extends between the first rectangular shaped portion and the third rectangular shaped portion, and the second lane extends between the second rectangular shaped portion and the fourth rectangular shaped portion;
  - a center defined at a location at which the first lane and the second lane intersect with each other, the center is surrounded by a plurality of corners of the plurality of rectangular shaped portions;

a first calibration mark at the center, and the first calibration mark is in close proximity to the plurality of corners, the first calibration mark includes:

a plurality of first active regions that are separate and distinct from each other, each respective first active region extends partially across the first calibration mark in the second direction;

a plurality of second active regions that are separate and distinct from each other, each respective second active region extends fully across the first calibration mark in the second direction, wherein a pair of second active regions is between a first group of the plurality of first active regions and a second group of the plurality of first active regions; and a plurality of first via regions that are spaced apart from the plurality of first active regions and the plurality of second active regions.

11. The device of claim 10, wherein the rectangular shaped portions are square shaped.

12. The device of claim 10, wherein the first calibration mark is less than 1 micrometer from the plurality of first corners of the plurality of rectangular shaped portions.

13. The device of claim 10, wherein the DBO mark further includes a plurality of second calibration marks, each respective second calibration mark of the plurality of second calibration marks is in close proximity to a corresponding second corner of a plurality of second corners of the plurality of rectangular shaped portions, the plurality of second corners being corners spaced furthest away from the center.

14. The device of claim 13, wherein each respective second calibration mark of the plurality of calibration marks includes:

a plurality of third active regions that are separate and distinct from each other, each respective third active region extends partially across the second calibration mark in the second direction;

a plurality of fourth active regions that are separate and distinct from each other, each respective fourth active region extends fully across the second calibration mark in the second direction, wherein a pair of fourth active regions is between a first group of the plurality of third active regions and a second group of the plurality of third active regions; and a plurality of second via regions that are spaced apart from the plurality of third active regions and the plurality of fourth active regions.

15. The device of claim 14, wherein the DBO further includes a plurality of lines including:

a first line extending in the first direction;

a second line extending in the first direction, and the second line being opposite to the first line about the plurality of rectangular shaped portions of the DBO mark;

a third line extending in the second direction, the third line extending from the first line to the second line;

a fourth line extending in the second direction, the fourth line extending from the first line to the second line, and the fourth line being opposite to the third line about the plurality of rectangular shaped portions of the DBO mark.

16. The device of claim 10, a ratio of size of the first calibration mark to a size of the DBO mark is less than 1/12.

17. The device of claim 10, wherein the first calibration mark is less than 0.01 micrometers from the plurality of rectangular shaped portions of the DBO mark.

18. A device, comprising:

a diffraction-based overlay (DBO) mark including:

an upper left portion, a lower right portion, a lower left portion, and an upper right portion, the upper left portion having an upper left corner, the lower right portion having a lower right corner, the lower left portion including a lower left corner, and the upper right portion includes an upper right corner;

a first lane extending in a first direction between the upper left portion and the upper right portion, and the first lane extending in the first direction between the lower left portion and the lower right portion;

a second lane extending in a second direction between the upper left portion and the lower left portion, and the second lane extending in the second direction between the upper right portion and the lower right portion; and a center defined at a location at which the first lane and the second lane intersect with each other, the center is surrounded by a plurality of first corners of the upper left portion, the lower left portion, the upper right portion, and the lower right portion, each respective first corner of the plurality of first corners is opposite to a corresponding one of the upper left portion, the lower left portion, the upper right portion, and the lower right portion;

a first calibration mark at the center, and the first calibration mark is in close proximity to the plurality of first corners, the first calibration mark includes:

a plurality of first active regions that are separate and distinct from each other, each respective first active region extends partially across the first calibration mark in the second direction;

a plurality of second active regions that are separate and distinct from each other, each respective second active region extends fully across the first calibration mark in the second direction, wherein a pair of second active regions is between a first group of the plurality of first active regions and a second group of the plurality of first active regions; and a plurality of first via regions that are spaced apart from the plurality of first active regions and the plurality of second active regions;

a plurality of lanes that surround the upper left portion, the upper right portion, the lower left portion, and the lower right portion of the DBO mark, the plurality of lanes define a periphery that surrounds the upper left portion, the upper right portion, the lower left portion, and the lower right portion of the DBO mark; and one or more second calibration marks along the periphery, the one or more second calibration marks including:

a plurality of third active regions that are separate and distinct from each other, each respective third active region extends partially across the second calibration mark in the second direction;

a plurality of fourth active regions that are separate and distinct from each other, each respective fourth active region extends fully across the second calibration mark in the second direction, wherein a pair of fourth active regions is between a first group of the plurality of third active regions and a second group of the plurality of third active regions; and a plurality of second via regions that are spaced apart from the plurality of third active regions and the plurality of fourth active regions.

19. The device of claim 18, wherein the first calibration mark is less than 0.01 micrometers from the upper left portion, the upper right portion, the lower left portion, and the lower right portion of the DBO mark.

20. The device of claim 18, wherein the first calibration mark is less than 0.01 micrometers from the upper left portion, the upper right portion, the lower left portion, and the lower right portion of the DBO mark.

* * * * *